(12) United States Patent
Gallarelli et al.

(10) Patent No.: US 7,957,148 B1
(45) Date of Patent: Jun. 7, 2011

(54) LOW PROFILE COMPUTER PROCESSOR RETENTION DEVICE

(75) Inventors: Pat Gallarelli, Pittsboro, NC (US);
David J. Jensen, Raleigh, NC (US);
Vinod Kamath, Raleigh, NC (US);
Brian M. Kerrigan, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/632,843

(22) Filed: Dec. 8, 2009

(51) Int. Cl.
*H05K 7/20* (2006.01)

(52) U.S. Cl. ........ 361/719; 361/704; 361/707; 361/710; 165/80.3; 174/16.3; 257/718; 257/719

(58) Field of Classification Search .................. None
See application file for complete search history.

(56) References Cited

U.S. PATENT DOCUMENTS

| | | | |
|---|---|---|---|
| 5,272,375 A | 12/1993 | Belopolsky | |
| 6,055,159 A * | 4/2000 | Sun | 361/704 |
| 6,400,577 B1 * | 6/2002 | Goodwin et al. | 361/816 |
| 6,404,634 B1 * | 6/2002 | Mann | 361/704 |
| 6,541,855 B2 * | 4/2003 | Uzuka | 257/712 |
| 6,611,431 B1 * | 8/2003 | Lee et al. | 361/719 |
| 6,657,131 B2 * | 12/2003 | Gonzalez et al. | 174/260 |
| 6,731,505 B1 * | 5/2004 | Goodwin et al. | 361/719 |
| 6,885,557 B2 | 4/2005 | Unrein | |
| 7,006,354 B2 | 2/2006 | Mochizuki et al. | |
| 7,187,553 B2 * | 3/2007 | Schmidberger | 361/719 |
| 7,219,421 B2 | 5/2007 | Vrtis et al. | |
| 7,283,368 B2 | 10/2007 | Wung et al. | |
| 7,289,335 B2 * | 10/2007 | Callahan et al. | 361/803 |
| 7,372,147 B2 * | 5/2008 | Dai et al. | 257/707 |
| 7,397,664 B2 | 7/2008 | Ankireddi | |
| 7,428,154 B2 | 9/2008 | Ishimine et al. | |
| 7,431,072 B2 | 10/2008 | Miyazaki et al. | |
| 7,518,235 B2 * | 4/2009 | Coico et al. | 257/719 |
| 2005/0068741 A1 | 3/2005 | Bailey et al. | |
| 2006/0021734 A1 | 2/2006 | Chang et al. | |

OTHER PUBLICATIONS

Annonymous; Method for a Bilinear Backside Load Plate; IP.com Prior Art Database, Technical Disclosure; Jun. 28, 2006; http://www.ip.com/pubview/IPCOM000137848D.

* cited by examiner

*Primary Examiner* — Boris L Chervinsky
(74) *Attorney, Agent, or Firm* — H. Barrett Spraggins; Cynthia G. Seal; Biggers & Ohanian, LLP.

(57) ABSTRACT

A low profile computer processor retention device, the computer processor including a processor substrate and a heat spreader mounted on the processor substrate. The retention device includes a retention housing. The retention housing is shaped to fit around a socket. The retention device also includes a load frame. The load frame is operatively coupled to the retention housing and is configured to retain the computer processor in the socket of a motherboard with direct contact between the load frame and the processor substrate. The load frame has a cutout. The retention device also includes a heat sink fastening member coupled to the retention housing and configured to fasten a heat sink to the retention housing and configured to couple the heat sink to the heat spreader through the cutout of the load frame.

14 Claims, 4 Drawing Sheets

LOW PROFILE COMPUTER PROCESSOR RETENTION DEVICE

BACKGROUND OF THE INVENTION

1. Field of the Invention

The field of the invention is processor retention devices, or, more specifically, low profile computer processor retention devices and computers configured with low profile computer processor retention devices 2. Description of Related Art The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Computer systems today are increasingly more computationally powerful due in large part to technological advances in processors. Current processors, however, generate a relatively large amount of a heat. Heat, if not efficiently dissipated, may cause errors and failure in a computer over time. Heat generation by processors and heat dissipation are important operational characteristics of a computer. Heat sinks are presently employed to dissipate heat generated by computer processors. The heat sink may be in physical contact with a heat spreader of a processor or may be in contact with a thermal grease applied to a heat spreader. The heat spreader is typically installed directly on an organic substrate of the processor. Physical contact between the heat sink and the heat spreader is effected through use of fasteners of a retention mechanism. A retention mechanism holds the processor in a socket on a motherboard and enables the heat sink to come into direct contact with the processor.

At the same time computer processors are increasing operating speeds and heat generation, size requirements for computers are decreasing. That is, computer enclosures are decreasing in size. Heat generation in a smaller enclosure has a greater effect on computer system components. In addition, efficiency of heat dissipation is greatly reduced due to reduced air flow volume in and through the enclosure.

Current retention mechanisms that hold processors into sockets and couple heat sinks to heat spreaders of the sockets are not optimized for smaller computer enclosures. For further explanation, FIG. 1 sets forth a line drawing of a cross-sectional view of a retention mechanism of the prior art. In FIG. 1, a computer processor consisting of an organic substrate (220) and a heat spreader (322) is installed in a socket (216). A retention frame (210) is connected to a housing (308) and is retaining the processor by direct contact on the heat spreader (322). Two spring-loaded screws are used to attach a heat sink (202) having a number of fins (204) to the heat spreader (322).

The heat sink (202) in FIG. 1 includes a number of fins (204). The surface area of the fins (204) is a critical variable to the effectiveness of the heat transfer. Increasing the surface area of the fins (204) increases the effectiveness of heat transfer and vice versa. However, with the ongoing decrease in enclosure size and an increase in computer processor and other computer component size, the surface area of heat sink fins (204) is jeopardized in current computers. An example of a computer having a smaller enclosure is an IBM Blade Server. The Blade Server is approximately 29 millimeters tall. With a processor installed and with the retention mechanism increasingly becoming larger, the heat sink fin (204) height has been reduced over time. In some cases, the heat sink fin heath is reduced such the surface area of the fins does not provide for a practical thermal solution for dissipating processor generated heat.

In addition to heat sink fin surface area, the geometry of the base of the heat sink (202) is another critical variable to the effectiveness of the heat sink (202). A heat sink with a large base and a continuous surface without steps or cutouts has better heat flux through the base then a heat sink of the same material with irregular geometry such as a pedestal from the base that extends downward to make contact with the heat spreader of the processor. In the example of FIG. 1, the heat sink (202) has a pedestal-type base. Current trends in processors and their associated hardware are driving more irregular shaped bases for the heat sinks and are therefore inefficient thermal solutions.

SUMMARY OF THE INVENTION

Low profile computer processor retention devices and computers configured with such computer processor retention devices are disclosed. The computer processor includes a processor substrate and a heat spreader mounted on the processor substrate. The computer processor retention device includes a retention housing. The retention housing is shaped to fit around a socket. The computer processor retention device also includes a load frame that is operatively coupled to the retention housing. The load frame is configured to retain the computer processor in the socket of a motherboard with direct contact between the load frame and the processor substrate.

The load frame also has a cutout. The computer processor retention device also includes a heat sink fastening member that is coupled to the retention housing and configured to fasten a heat sink to the retention housing. The heat sink fastening member is also configured to couple the heat sink to the heat spreader through the cutout of the load frame.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 1:
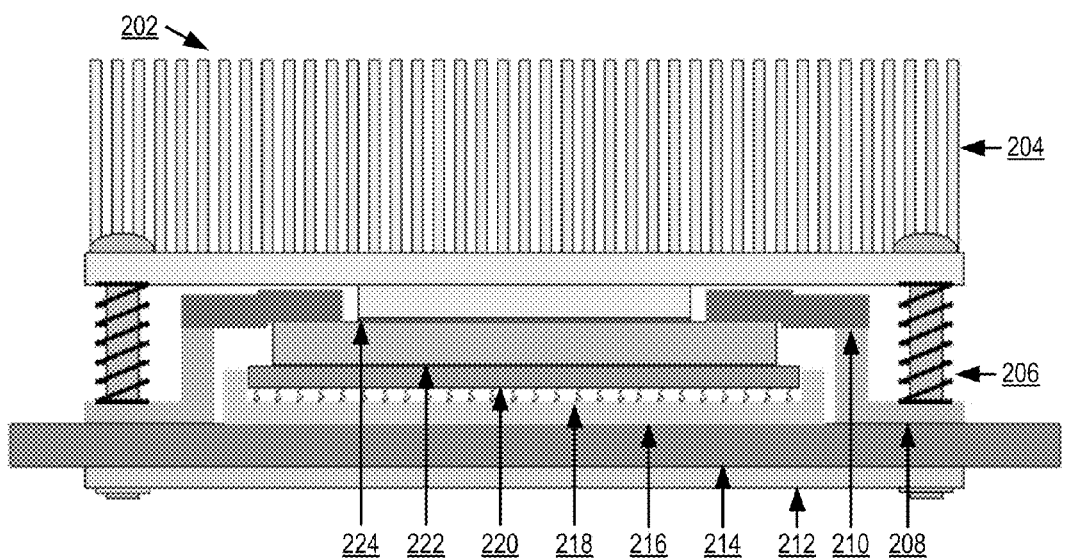
FIG. 1 sets forth a line drawing of a cross-sectional view of a retention mechanism of the prior art.
Figure 2:
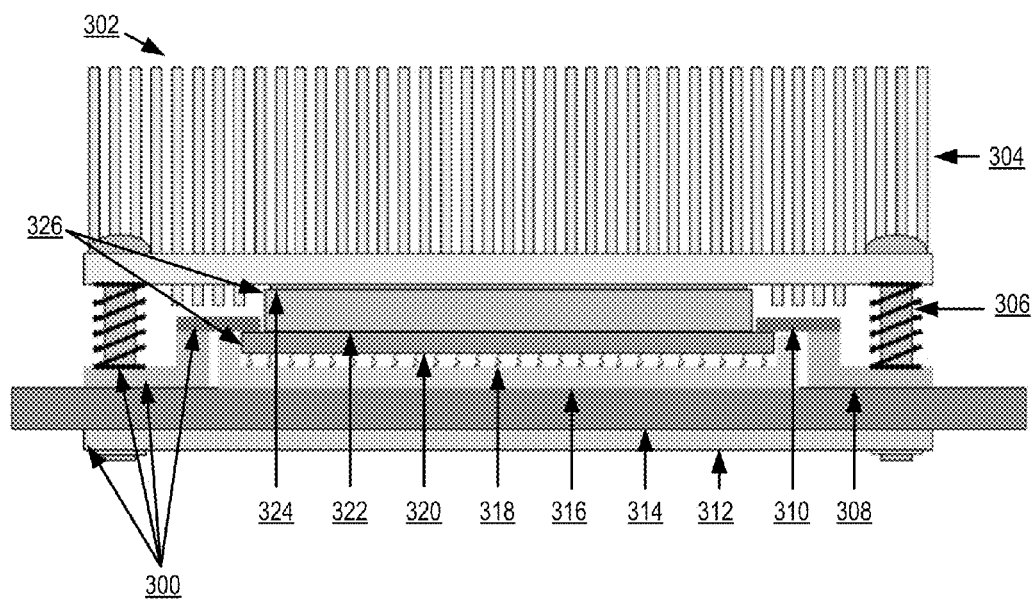
FIG. 2 depicts a line drawing of a cross-sectional view of a computer processor subsystem having an example low profile computer processor retention device configured according to embodiments of the present invention.

Exemplary low profile computer processor retention devices and computers configured with low profile computer processor retention devices in accordance with embodiments of the present invention are described with reference to the accompanying drawings, beginning with FIG. 2. FIG. 2 depicts a line drawing of a cross-sectional view of a computer processor subsystem having an example low profile computer processor retention device (300) configured according to embodiments of the present invention. The term 'low profile' is used in this specification to describe computer processor retention devices configured in accordance with embodiments of the present invention and contrast retention mechanisms of the prior art. More specifically, the distance from a motherboard to the top of load frame in low profile computer processor retention devices configured according to embodiments of the present invention is less than the distance from a motherboard to the top of a retention frame (210 of FIG. 1) of a retention mechanisms of the prior art (FIG. 1).

In the example of FIG. 2, the computer processor (326) includes a processor substrate (320) and a heat spreader (322) mounted on the processor substrate (320). A processor substrate is material upon which one or more semiconductor devices forming the operational units of a computer processor are located. In some embodiments, a processor substrate may be implemented as a printed circuit board (PCB), an electrically insulating portion of a PCB, a ceramic wafer, and so on as will occur to readers of skill in the art. Such processor substrates may also be referred to as "organic substrates."

A heat spreader is (322) is a primary heat exchanger that moves heat between a heat source and a secondary heat exchanger—in this example of FIG. 2, a heat sink (302). The secondary heat exchanger, the heat sink (302), is larger in cross sectional area, surface area, and volume. A heat spreader may be implemented as a copper plate having high thermal conductivity. The heat generated by a processor (300) is spread out such that the heat sink has a larger cross sectional area contacting the heat spreader than the heat source. The heat flow is the same in both heat exchangers, but the heat flux density is less in the secondary. The secondary heat exchanger, the heat sink (302), may be implemented as a variety of metals and metal alloys, such as aluminum.

In the example of FIG. 2, the top a thermal interface material (324) is applied to the top of the heat spreader (322). A thermal interface material is (324) is a material used to fill gaps between thermal transfer surfaces, such as gaps formed between microprocessors and heat sinks, in order to increase thermal transfer efficiency. These gaps would otherwise be filled with air which is a very poor conductor. Thermal interface material may take many forms. One form is a white-colored paste or thermal grease. Such thermal grease may be silicone oil filled with aluminum oxide, zinc oxide, or boron nitride. Some thermal interfaces use micronized or pulverized silver. Another form of thermal interface materials is phase-change materials. Phase-change materials are solid at room temperature and liquefy and behave like grease at operating temperatures. Such phase-change materials offer the benefit of ease of use.

The example computer processor retention device (300) of FIG. 2 includes a retention housing (308). The retention housing (308) in the example of FIG. 2 is shaped to fit around a socket (316). The term retention housing as used in this specification describes an apparatus capable of surrounding a socket on all sides except top and bottom.

The example computer processor retention device (300) of FIG. 2 also includes a load frame (310). A load frame is a plate that presses and a processor into and retains a processor in a motherboard socket. The load frame (310) in the example of FIG. 2 is operatively coupled to the retention housing (308). A load frame may, for example, be coupled to the retention housing by a hinge. The load frame (310) of FIG. 2 differs from the retention frame (210) of the prior art retention mechanism of FIG. 1 in that the load frame (310) of FIG. 2 is configured to retain the computer processor (326) in the socket of a motherboard with direct contact between the load frame and the processor substrate. Rather than retaining a computer processor (326) in a socket with direct contact on the heat spreader, as in the prior art retention frame (210) of FIG. 1, the load frame (310) of FIG. 2 directly contacts the processor substrate. Although not depicted in the example of FIG. 2 due to the cross-sectional view, the load frame (310) also has a cutout. Cutouts of load frames useful in computer processor retention devices configured according to embodiments of the present invention are described and depicted in greater detail below with respect to FIG. 3.

Figure 3:
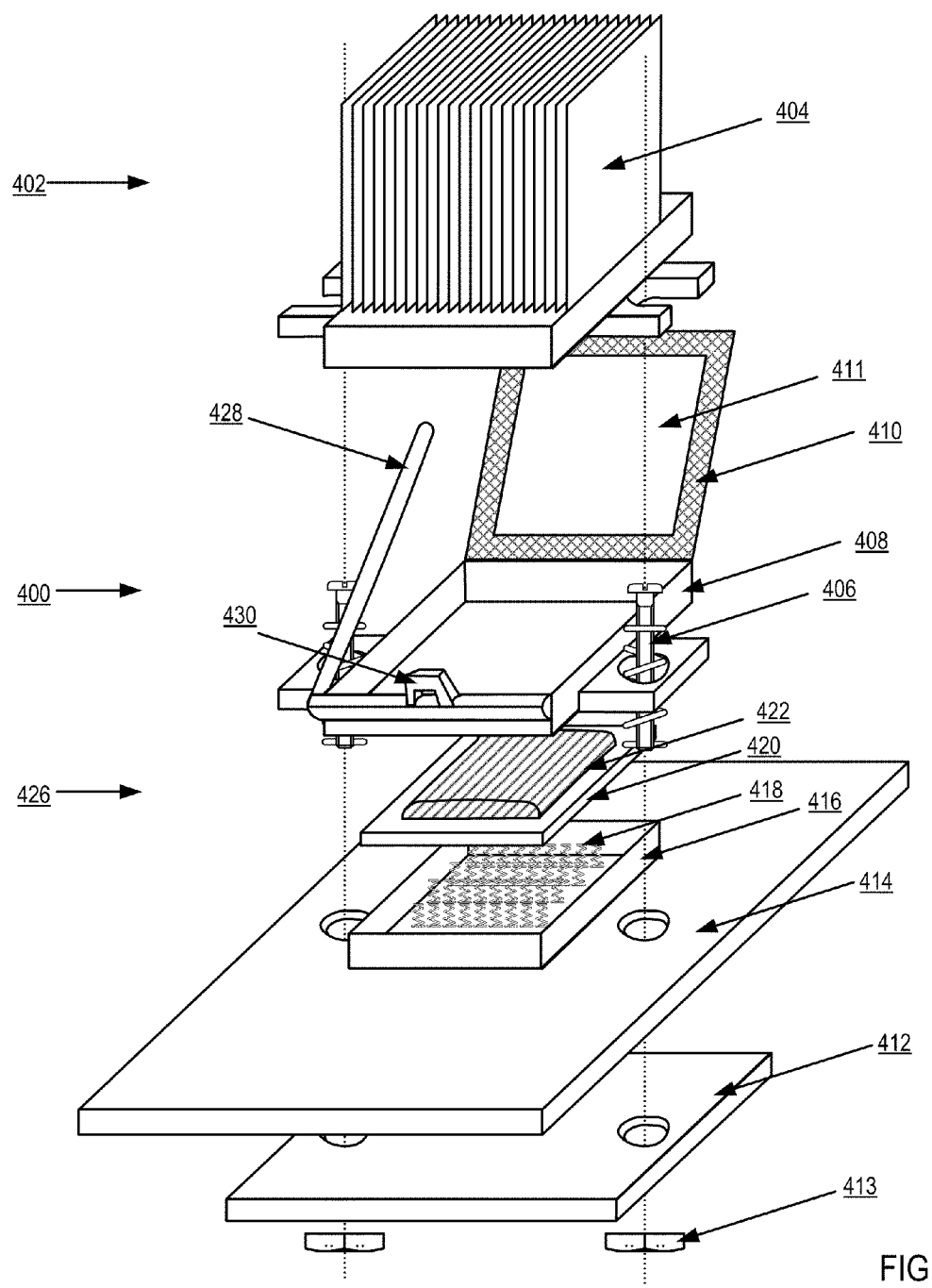
FIG. 3 sets forth a line drawing of an exploded perspective view of a computer processor subsystem having an example low profile processor retention device configured according to embodiments of the present invention.

The example low profile computer processor retention device (300) of FIG. 2 also includes a heat sink fastening member (306) coupled to the retention housing (308) and configured to fasten a heat sink (302) to the retention housing (308). The heat sink fastening member (306) is also configured to couple the heat sink (302) to the heat spreader (322) through the cutout of the load frame (310). In the example low profile computer processor retention device (300) of FIG. 3, the retention housing (308) is configured to couple the heat sink (302) to the heat spreader (322) by compressing the heat sink (302) to the thermal interface material (324) applied to the heat spreader (322). Although a heat sink fastening member (306) useful in retention devices configured in accordance with embodiments of the present invention may be implemented as a variety of fastener types, the example heat sink fastening members (306) of FIG. 3 are implemented as spring-loaded fasteners configured to compress the heat sink (302) to the processor (326).

The heat sink (302) in the example of FIG. 2 is similar to the heat sink (202) in the example of FIG. 1 in that the heat sink (302) has a number fins (304). The fins (304) in the example of FIG. 2, however, have a greater vertical height and thus, greater surface area, than the fins (204) of FIG. 1. The fins are allowed greater vertical height due to the lower profile of the load frame (310) which 2 contacts the substrate (320) of the processor rather than the heat spreader (322). As mentioned above, greater surface area of fins provide greater heat dissipation of processor (326) generated heat. In addition to having greater height relative to the prior art heat sink of FIG. 1, the heat sink (302) of FIG. 2 also has non-irregular shaped base that contacts a greater surface are of the heat spreader (322). By contrast, the heat sink (202) of FIG. 1 includes a pedestal-style base with less surface area contacting the heat spreader (222) of FIG. 2. The heat sink (302) of FIG. 2, therefore, provides greater heat transfer, through the base and greater heat dissipation by the fins of the heat sink (302) in comparison to heat sinks of the prior art.

The example low profile computer processor retention device (300) of FIG. 2 also includes a load plate (312). In the example of FIG. 2, the load plate (312) and the retention housing (308) are fastened to one another on opposite faces of the motherboard (314) by the heat sink fastening member (306). The retention housing (308) in the example of FIG. 2 is positioned on the motherboard around the socket (316) by the fasteners (306) for clarity of explanation only. Readers of skill in the art will immediately recognize that retention housings useful in low profile computer processor retention devices (300) according to embodiments of the present invention may be position on a motherboard in various ways such as, for example, by affixing the housing to the motherboard with an adherent, soldering pads of the housing to pads of the motherboard, laminating the housing to the motherboard, inserting mounting pins of the housing into a housing socket-holes of the motherboard, and so on.

In the example low profile computer processor retention device (300) of FIG. 2, the socket (316) is a land grid array (LGA) socket that includes a number of spring contacts (318). LGA is a type of surface-mount packaging used for integrated circuits. LGA packaging may be electrically connected to traces of a PCB by use of a socket, soldering directly to a PCB, or in other ways. Example processors that implement the LGA interface include Intel's™ Pentium 4™, Xeon™, Core i7™, Advanced Micro Devices (AMD™) Opteron™ family of processors, and others. In some LGA implementations there are no pins on the chip. In place of the pins are pads of bare gold-plated copper configured to contact pins on the motherboard.

For further explanation, FIG. 3 sets forth a line drawing of an exploded perspective view of a computer processor subsystem having an example low profile processor retention device (400) configured according to embodiments of the present invention. The computer processor (426) in the example of FIG. 3 includes a processor substrate (420) and a heat spreader (422). The heat spreader (422) in the example of FIG. 3 is mounted on the processor substrate (420).

The example low profile computer processor retention device (400) of FIG. 3 includes a retention housing (408). The retention housing (408) is shaped to fit around a socket (416). The socket (416) in the example of FIG. 3 is an LGA socket configured with a number of spring contacts (418) configured to contact pads of the processor (426).

The example low profile computer processor retention device (400) of FIG. 3 also includes a load frame (410). The example load frame (410) of FIG. 3 is operatively coupled to the retention housing (408). As mentioned above the load frame (410) may operatively coupled to the retention housing (408) in a variety of ways including, for example, by hinge. The example load frame (410) of FIG. 3 is configured to retain the computer processor (426) in the socket (416) of the motherboard (414) with direct contact between the load frame (410) and the processor substrate (420). In the example of FIG. 3, the load frame (410) has a cutout (411) through which the heat spreader (422) of the processor (426) and the heat sink (402) contact. In the example low profile computer processor retention device (400) of FIG. 3, the retention housing (408) includes a lever (428) latch (430) configured to latch the load frame when the load frame is in a closed position, enclosing the computer processor (426) within the socket (416) and retention housing (408).

The example low profile computer processor retention device (400) of FIG. 3 also includes two heat sink fastening members (406) coupled to the retention housing (408). The heat sink fastening members (406) are configured to fasten a heat sink (402) to the retention housing (408). The heat sink fastening members (406) are also configured to couple the heat sink (402) to the heat spreader (422) through the cutout (411) of the load frame (410). In the example of FIG. 3, the heat sink fastening members (406) are spring-loaded fasteners configured to compress the heat sink to the processor. The heat sink (402) in the example of FIG. 3 includes a number of fins (404) having increased surface area relative to heat sinks used with retention mechanism of the prior art.

The example computer processor subsystem of FIG. 3 also includes a load plate (412). The load plate (412) and the retention device (400) are coupled to one another on opposite faces of the motherboard (414) by the heat sink fastening members (406). Although the example of FIG. 3 depicts a load plate used in part to hold the retention housing to the motherboard, the retention housing may be held in place in various ways as will occur to readers of skill in the art. The retention housing (408), as one example, may be affixed to the motherboard (414) by soldering or adhesive or in other ways as will occur to readers of skill in the art.

Low profile computer processor retention devices such as the example devices depicted in the FIG. 2 and FIG. 3 are generally implemented as part of a computer, that is, in automated computing machinery. For further explanation, therefore, FIG. 4 sets forth a block diagram of automated computing machinery comprising an exemplary computer (152) configured with a low profile computer processor retention device in accordance with embodiments of the present invention. The computer (152) of FIG. 4 includes at least one computer processor (156) or 'CPU' in a computer processor subsystem (102).

Figure 4:
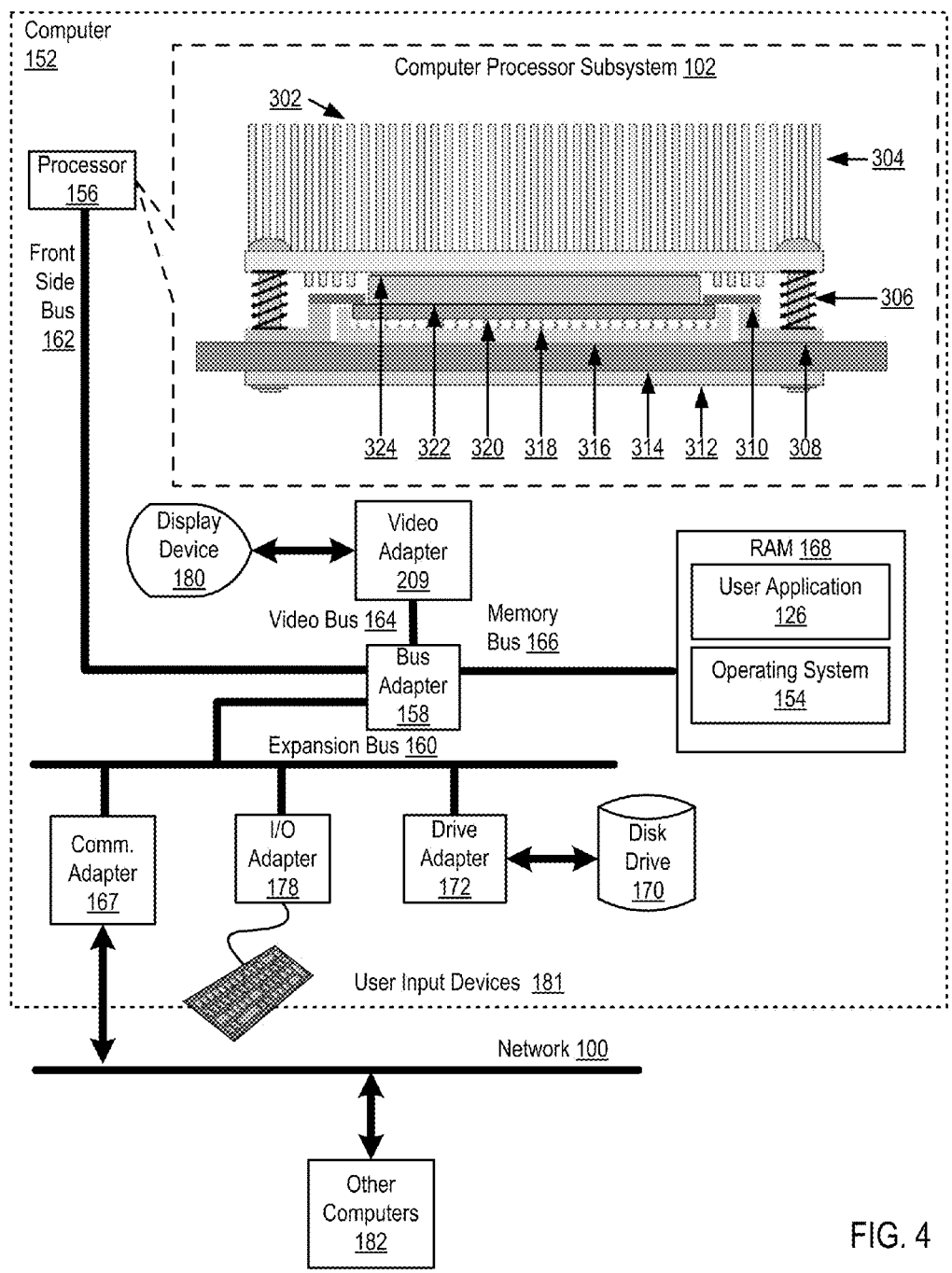
FIG. 4 sets forth a block diagram of automated computing machinery comprising an exemplary computer configured with a low profile computer processor retention device in accordance with embodiments of the present invention.

The example computer processor subsystem (102) is configured with a low profile retention device in accordance with embodiments of the present invention. The computer processor (156) in the example of FIG. 4 includes a processor substrate (320) and a heat spreader (322) mounted on the processor substrate (320). The computer processor (156) in the example of FIG. 4 is installed in a socket (316) of a motherboard (314). In the example of FIG. 4, the socket (316) is an LGA socket that includes a number of spring-contacts (318).

The example computer processor subsystem (102) of FIG. 4 includes a computer processor retention device that, in turn, includes a retention housing (308). The retention housing (308) is shaped to fit around the socket (316). The retention device also includes a load frame (310). The load frame (310) in the example of FIG. 4 is operatively coupled to the retention housing (308). The load frame (310) is retaining the computer processor (156) in the socket (316) with direct contact between the load frame (310) and the processor substrate (320). The load frame has a cutout through which the heat spreader (322), applied with a thermal interface material (324), and the heat sink (302) contact. The retention device of FIG. 4 also includes two heat sink fastening members (306) coupled to the retention housing (308).

The example computer processor subsystem (102) of FIG. 4 also includes a heat sink (302) fastened to the retention housing (308) by the heat sink fastening members (306). The heat sink (302) is also coupled by the heat sink fastening members (306) to the heat spreader (322) through the cutout of the load frame (310). The heat sink includes one or more heat dissipating fins (304) configured to dissipate heat generated by the computer processor (156).

The processor (156) is connected through a high speed memory bus (166) and bus adapter (158) to random access memory (168) (RAM') and to other components of the computer (152). Stored in RAM (168) is a user application (126), a module of computer program instructions for carrying out user-level data processing tasks. Examples of user applications (126) include word processor applications, spreadsheet applications, multimedia applications, email applications, and so on as will occur to readers of skill in the art. Also stored in RAM (168) is an operating system (154). Operating systems useful in computers configured with low profile computer processor retention devices according to embodiments of the present invention include UNIX™, Linux™, Microsoft XP™, AIX™, IBM's i5/OS™ and others as will occur to those of skill in the art. The operating system (154) and user application (126) in the example of FIG. 4 are shown in RAM (168), but many components of such software typically are stored in non-volatile memory also, such as, for example, on a disk drive (170).

The computer (152) of FIG. 4 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers configured with low profile computer processor retention devices according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 4 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 4 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The exemplary computer (152) of FIG. 4 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured with low profile computer processor retention devices according to embodiments of the present invention include modems for wired dial-up communications, Ethernet (IEEE 802.3) adapters for wired data communications network communications, and 802.11 adapters for wireless data communications network communications.

The arrangement of computers and other devices making up the exemplary system illustrated in FIG. 4 are for explanation, not for limitation. Data processing systems useful according to various embodiments of the present invention may include additional servers, routers, other devices, and peer-to-peer architectures, not shown in FIG. 4, as will occur to those of skill in the art. Networks in such data processing systems may support many data communications protocols, including for example TCP (Transmission Control Protocol), IP (Internet Protocol), HTTP (HyperText Transfer Protocol), WAP (Wireless Access Protocol), HDTP (Handheld Device Transport Protocol), and others as will occur to those of skill in the art. Various embodiments of the present invention may be implemented on a variety of hardware platforms in addition to those illustrated in FIG. 4.

In view of the explanations set forth above, readers will recognize that the benefits of low profile computer processor retention devices configured in accordance with embodiments of the present invention include:

Greater surface area of a heat spreader of a processor may be exposed for increased heat transfer through a heat sink or through air;

Greater surface area of the contact between a heat sink and a heat spreader;

Greater height, and therefore surface area, of fins of a heat sink, increasing heat dissipation;

Reduction in material costs of retention mechanisms due to a reduction in size of retention devices; And Greater amount of air flow volume available in an enclosure having the same size as an enclosure that includes a retention mechanism of the prior art.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A low profile computer processor retention device for a computer processor, the computer processor comprising a processor substrate and a heat spreader mounted on the processor substrate, the computer processor retention device comprising:

a retention housing, the retention housing shaped to fit around a socket;

a load frame, the load frame operatively coupled to the retention housing, the load frame configured to retain the computer processor in the socket of a motherboard with direct contact between the load frame and the processor substrate, the load frame having a cutout; and a heat sink fastening member coupled to the retention housing and configured to fasten a heat sink to the retention housing and configured to couple the heat sink to the heat spreader through the cutout of the load frame.

2. The low profile computer processor retention device of claim 1 further comprising a load plate, wherein the heat sink fastening member is further configured to fasten the retention housing and the load plate on opposite faces of the motherboard.

3. The low profile computer processor retention device of claim 1 wherein the retention housing is configured to couple the heat sink to the heat spreader by compressing the heat sink to thermal interface material applied to the heat spreader.

4. The low profile computer processor retention device of claim 1 wherein the thermal interface material comprises a thermal grease.

5. The low profile computer processor retention device of claim 1 wherein the socket comprises a land grid array socket, the land grid array socket comprising a plurality of spring contacts.

6. The low profile computer processor retention device of claim 1 wherein the heat sink fastening member comprises a spring-loaded fastener configured to compress the heat sink to the processor.

7. The low profile computer processor retention device of claim 1 wherein the retention housing further comprises a lever latch configured to latch the load frame when the load frame is in a closed position, enclosing the computer processor within the socket and retention housing.

8. A computer comprising:
- a computer processor, the computer processor comprising a processor substrate and a heat spreader mounted on the processor substrate, the computer processor installed in a socket of a motherboard;
- a computer processor retention device for the computer processor, the computer processor retention device comprising:
  - a retention housing, the retention housing shaped to fit around the socket;
  - a load frame, the load frame operatively coupled to the retention housing, the load frame retaining the computer processor in the socket with direct contact between the load frame and the processor substrate, the load frame having a cutout; and
  - a heat sink fastening member coupled to the retention housing; and
- a heat sink fastened to the retention housing by the heat sink fastening member and coupled by the heat sink fastening member to the heat spreader through the cutout of the load frame, the heat sink comprising one or more heat dissipating fins, the heat dissipating fins dissipating heat generated by the computer processor.

9. The computer of claim 8 wherein the computer processor retention device further comprises a load plate, the retention housing and the load plate are fastened by the heat sink fastening member on opposite faces of the motherboard.

10. The computer of claim 8 the heat sink is coupled by the retention housing to the heat spreader by compressing the heat sink to thermal interface material applied to the heat spreader.

11. The computer of claim 10 wherein the thermal interface material comprises a thermal grease.

12. The computer of claim 8 wherein the socket comprises a land grid array socket, the land grid array socket comprising a plurality of spring contacts.

13. The computer of claim 8 wherein the heat sink fastening member comprises a spring-loaded fastener compressing the heat sink to the processor.

14. The computer of claim 8 wherein the retention housing further comprises a lever latch configured to latch the load frame when the load frame is in a closed position, enclosing the computer processor within the socket and retention housing.

* * * * *